US009672781B2

(12) United States Patent
Reithmaier et al.

(10) Patent No.: US 9,672,781 B2
(45) Date of Patent: *Jun. 6, 2017

(54) COST EFFECTIVE LOW PIN/BALL COUNT LEVEL-SHIFTER FOR LCD BIAS APPLICATIONS SUPPORTING CHARGE SHARING OF GATE LINES WITH PERFECT WAVEFORM MATCHING

(71) Applicant: Texas Instruments Deutschland GmbH, Freising (DE)

(72) Inventors: Stefan A. Reithmaier, Vilsheim (DE); Josy Bernard, Freising (DE); Carsten I. Stoerk, Freising (DE); Nicolas M Guibourg, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/989,424

(22) Filed: Jan. 6, 2016

(65) Prior Publication Data

US 2016/0196791 A1  Jul. 7, 2016

Related U.S. Application Data

(63) Continuation of application No. 14/135,092, filed on Dec. 19, 2013, now Pat. No. 9,251,753.

(Continued)

(51) Int. Cl.
*G09G 3/36*  (2006.01)

(52) U.S. Cl.
CPC ......... *G09G 3/3655* (2013.01); *G09G 3/3659* (2013.01); *G09G 3/3674* (2013.01);

(Continued)

(58) Field of Classification Search
CPC .............. G09G 3/3659; G09G 3/3674; G09G 2330/023; G09G 2310/0289; G09G 3/3655; G09G 3/3685

See application file for complete search history.

(56) References Cited

U.S. PATENT DOCUMENTS

| 7,817,172 B2 | 10/2010 | Hong et al. |
| 2001/0015715 A1* | 8/2001 | Hebiguchi ........... G09G 3/3648 345/92 |

(Continued)

OTHER PUBLICATIONS

PCT Search Report for PCT/US14/39564, mailed Dec. 11, 2014 (1 page).

(Continued)

*Primary Examiner* — Nalini Mummalaneni
*Assistant Examiner* — Ivelisse Martinez Quiles
(74) *Attorney, Agent, or Firm* — William B. Kempler; Charles A. Brill; Frank D. Cimino

(57) ABSTRACT

A level shifter circuit has a plurality of channels for providing signals to a capacitive load and has circuits for sharing charge stored in the capacitive load between the channels. A first pair of channel clock generating circuits are coupled respectively to a first pair of channels. A second pair of channel clock generating circuits are coupled respectively to a second pair of channels. A pair of switches couple the first pair of channels together and the second pair of channels together, respectively, for sharing charge between the channels. A single resistor is coupled in circuit with all of the channels for controlling a slope of charge sharing between channels.

13 Claims, 8 Drawing Sheets

Related U.S. Application Data

(60) Provisional application No. 61/827,464, filed on May 24, 2013.

(52) U.S. Cl.
CPC ... *G09G 3/3685* (2013.01); *G09G 2310/0289* (2013.01); *G09G 2330/023* (2013.01)

(56) References Cited

U.S. PATENT DOCUMENTS

| | | | |
|---|---|---|---|
| 2004/0041763 A1 | 3/2004 | Kodama et al. | |
| 2008/0297676 A1 | 12/2008 | Kimura | |
| 2010/0277220 A1* | 11/2010 | Stoerk | H03K 19/0019 327/437 |
| 2011/0012822 A1 | 1/2011 | Park et al. | |
| 2011/0193839 A1* | 8/2011 | Smith | G09G 3/3677 345/208 |
| 2013/0027283 A1* | 1/2013 | Cristaudo | G09G 3/3674 345/87 |
| 2013/0082996 A1* | 4/2013 | Kim | G09G 3/3677 345/210 |

OTHER PUBLICATIONS

Search Report for European Application No. 14800939.2, mailed Jan. 5, 2017 (11 pages).

\* cited by examiner

COST EFFECTIVE LOW PIN/BALL COUNT LEVEL-SHIFTER FOR LCD BIAS APPLICATIONS SUPPORTING CHARGE SHARING OF GATE LINES WITH PERFECT WAVEFORM MATCHING

CROSS-REFERENCE TO RELATED APPLICATIONS

This patent application is a continuation of U.S. Nonprovisional patent application Ser. No. 14/135,092, filed Dec. 19, 2013, which claims priority from U.S. Provisional Application No. 61/827,464, filed May 24, 2013, which is incorporated herein by reference in its entirety for all purposes.

FIELD OF THE INVENTION

The invention relates to a level shifter circuit and more specifically to a level shifter circuit for a display.

BACKGROUND OF THE INVENTION

Liquid crystal displays (LCDs) are widely used in computer monitors, laptop computers, tablet computers, cellular telephones, video players, cameras, watches and television sets, as well as other devices. LCDs are chosen because they are small in size, light in weight, low in power consumption and able to produce high-resolution images. LCDs are often in the form of display panels having row and column address lines coupled to pattern generator electronics which generate patterns or video on the display. As is well known, the voltage required by the LCD is often much greater than the voltage handling capacity of the pattern generator electronics. Therefore, it is common to utilize a level shifter circuit between the pattern generator electronics and the display to convert a lower voltage signals from the pattern generator electronics to the voltage required to drive the display.

The row lines of the display can be modeled as a capacitor in series with a resistor. As is well known, the power required to charge up the capacitive load is a significant portion of the power required to drive the display. Thus, it is common to share this charge between a first row line and a second row line, which are operated out of phase with each other. This charge sharing phase is illustrated in FIG. 1 generally as 100. The two clock signals 102, 104 are 180° out of phase with each other and share charge during the time periods shown in the rectangles 106, 108 and 110. In rectangle 106 charging can be seen at 112 and the discharging can be seen at 114. In rectangle 108, the discharging can be seen at 116 and charging can be seen at 118. In rectangle 110 charging can be seen at 120 and discharging can be seen at 122

A prior art LCD system having an LCD panel 204 and a driving circuit 202 is shown in FIG. 2 generally as 200. The driving circuit 202 includes circuitry for performing the charge sharing shown in FIG. 1. In FIG. 2, each of the row lines of the LCD panel 204 is modeled as a resistor $R_{ASG}$ in series with a capacitor $C_{ASG}$. Circuit 202 comprises, inter alia, a gate driver circuit 218 driving buffers 206, 208 and providing a signal to charge transfer transistors 214, 216. Diodes 210, 212 prevent reverse current flow. When activated, transistor 214 allows current to flow as shown by dotted lines 220, and transistor 216, when activated, allows current to flow as shown by dotted lines 222. Resistors $R_{CS}$ and our $R_{BCS}$ control the slope of the charge/discharge in order to reduce visual effects on the LCD panel. One disadvantage of the circuit is that it requires two pins or balls for each channel.

FIG. 3 shows a prior art circuit 300 which utilizes transistors 314, 316 in place of the diodes 210, 212 shown in FIG. 2, and which allows the utilization of a single resistor R1 in place of the two resistors RCS and $R_{BCS}$ shown in the circuit of FIG. 2.

FIG. 4 shows a prior art circuit for driving four row lines or channels generally as 400. For ease of illustration, the integrated circuit 402 is shown divided into a left side and right side circuit, but those skilled in the art will recognize that only a single integrated circuit is required. This circuit utilizes the single resistor charge sharing scheme shown in FIG. 3. The row lines 406, 414, 422, 424 are each modeled as a resistor in series with a capacitor to ground. The driver circuit for row 406 comprises a push-pull circuit consisting of transistors M1a and M2a coupled between VDD and VSS and having an output coupled to channel CLK1. Transistors M3a correspond to the transistors 314, 316 shown in FIG. 3, which replace the diodes 210, 212 in FIG. 2. Parasitic capacitor 404 is present at pin CLK1 and parasitic capacitor 408 is present at pin CS1. These parasitic capacitors are a result of the electrostatic discharge (ESD) circuits at those pins as well as the parasitic capacitances of the transistors M3a.

Similarly, the driver circuit for row 422 comprises a push-pull circuit consisting of transistors M1b and M2b coupled between VDD and VSS and having an output coupled to channel CLKB1. Parasitic capacitance 410 is present on pin CLKB1. The driver circuit for row 414 comprises a push-pull circuit consisting of transistors M1c and M2c coupled between VDD and VSS and having an output coupled to channel CLK2. Transistors M3c correspond to the transistors 314, 316 shown in FIG. 3, which replace the diodes 210, 212 in FIG. 2. Parasitic capacitor 412 is present at pin CLK2 and parasitic capacitor 416 is present at pin CS2. These parasitic capacitors are as a result of the ESD circuits at those pins as well as the parasitic capacitances of the transistors M3c. The driver circuit for row 424 comprises a push-pull circuit consisting of transistors M1d and M2d coupled between VDD and VSS and having an output coupled to channel CLKB2. Parasitic capacitor 420 is present at pin CLKB2.

Although this circuit allows the resistors $R_{CS}$ to be shared between a channel pair [RS1] and thus reduces the pin count, it creates a new problem for the latest LCDs and fails to solve an older problem. A problem is created for the latest LCDs in that driving channel 406, for example, includes the effects of the parasitic capacitance 408, whereas driving line 422 does not include this parasitic capacitance. A similar situation exists when sharing charge between the two row lines. Thus, the slope of the charging (rising) and discharging (falling) waveforms will be different, as illustrated in FIG. 5A showing the slope of the charging waveform and FIG. 5B showing the slope of the discharging waveform. This difference in slope creates a DC offset as shown in FIG. 6, generally as 600. The DC offset is shown at the right side of the waveform. This can create objectionable visual effects on the latest LCDs. Furthermore, the older problem that is not solved, is the fact that although resistors are shared between two channels, different resistors, normally discrete components, are utilized for each pair of channels. There will be a difference in resistance between these shared resistors, which can give rise to differences in the slope during charge sharing, which may result in objectionable visual effects on the display.

Thus, there is a need for improved level shifter for LCD applications.

SUMMARY OF THE INVENTION

It is a general object of the invention to provide a level shifter circuit where a single resistor can be shared between a plurality of channels.

This and other features and objects of the invention can be proved by a aspect of the invention which includes a level shifter for a liquid crystal display (LCD) comprising first row line control circuit to control a first row line of the LCD. A second row line control circuit controls a second row line of the LCD. A third row line control circuit controls a third row line of the LCD. A fourth row line control circuit controls a fourth row line of the LCD. A first switch is coupled to the first and the second row line control circuits for sharing charge stored on the first row line with the second row line. A second switch is coupled to the third row line control circuit and the fourth row line control circuit for sharing charge stored on the third row line with the fourth row line. A single resistor is coupled between the first switch and the second row line control circuit and coupled between the second switch and the fourth row line control circuit, wherein the slope of charge and discharge voltages on the row lines are substantially identical.

Another aspect of the invention comprises a liquid crystal display (LCD) comprising: an LCD panel having pixels arranged in rows and columns. A level shifter circuit is coupled to at least four row lines of the LCD panel, the level shifter shifting the voltage level of signals generated by a display pattern generator circuit to control the row lines of the LCD panel. A plurality of switches are each coupled between a pair of row lines for sharing charge stored on one row line with a second row line through a single resistor.

A further aspect of the invention is provided by a level shifter circuit having a plurality of channels for providing signals to a capacitive load and having circuits for sharing charge stored in the capacitive load between the channels. A first pair of channel clock generating circuits are coupled respectively to a first pair of channels. A second pair of channel clock generating circuits are coupled respectively a second pair of channels. A pair of switches couples the first pair of channels together and the second pair of channels together, respectively, for sharing charge between the channels. A single resistor coupled in circuit with all of the channels for controlling a slope of charge sharing between channels.

BRIEF DESCRIPTION OF DRAWINGS

Further aspects of the invention will appear from the appending claims and from the following detailed description given with reference to the appending drawings.

DETAILED DESCRIPTION OF EXAMPLE EMBODIMENTS

Figure 7:
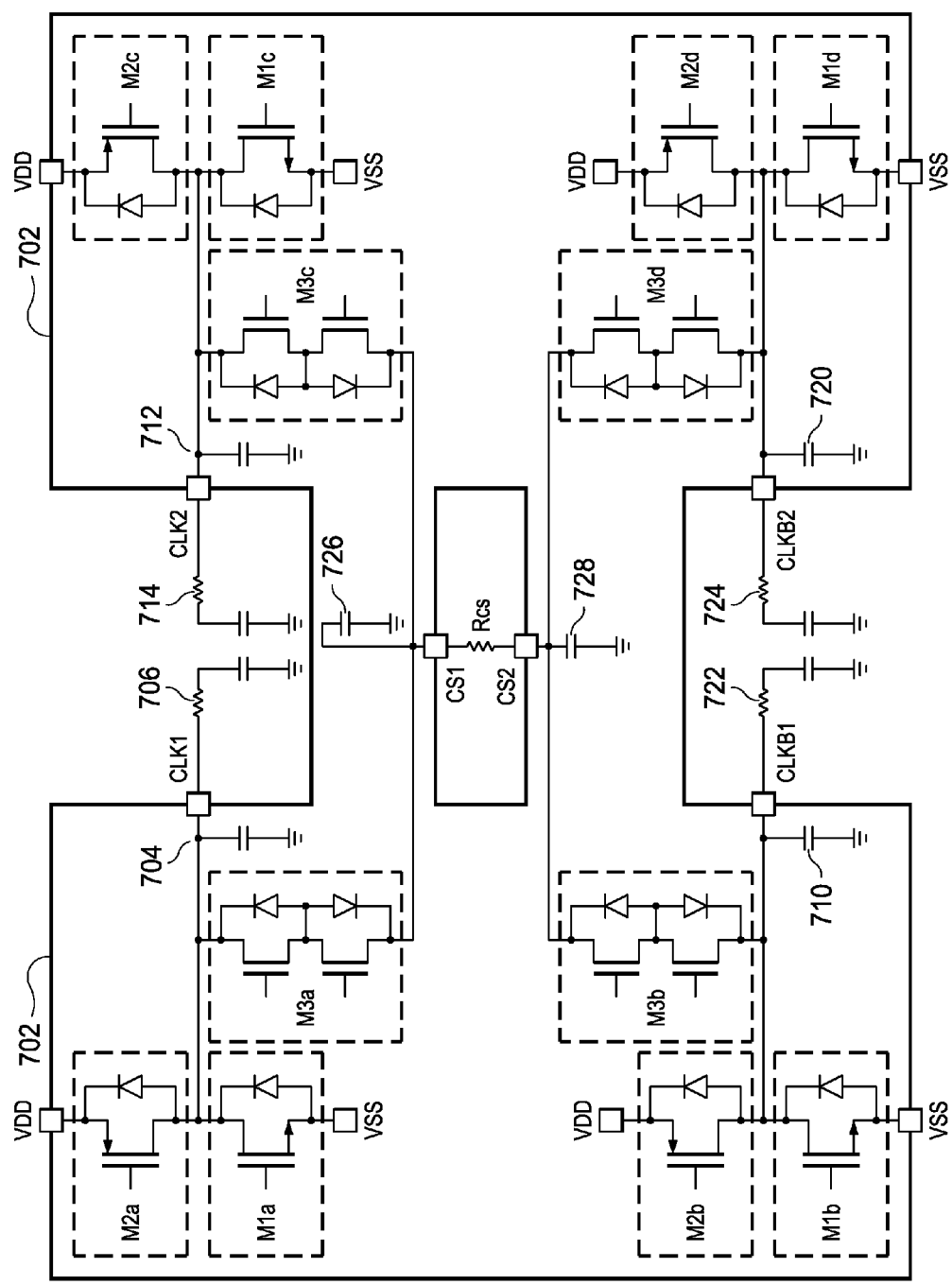
FIG. 7 is a schematic diagram of a level shifter circuit of the present invention having improved charge sharing characteristics.

Referring now to FIG. 7, an embodiment of the present invention is shown generally as 700. The circuit 700 includes an integrated circuit portion 702. It is to be understood that the "H" configuration shown for the integrated circuit 702 is for clarity of illustration only. Those skilled in the art will recognize that this circuit can be implemented in other shapes and sizes appropriate for an integrated circuit without departing from the present invention. The integrated circuit 702 drives four rows or channels 706, 722, 714 and 724 of LCD. Each of the rows or channels is modeled as a resistor in series with a capacitor (unlabeled in FIG. 7).

Figure 1:
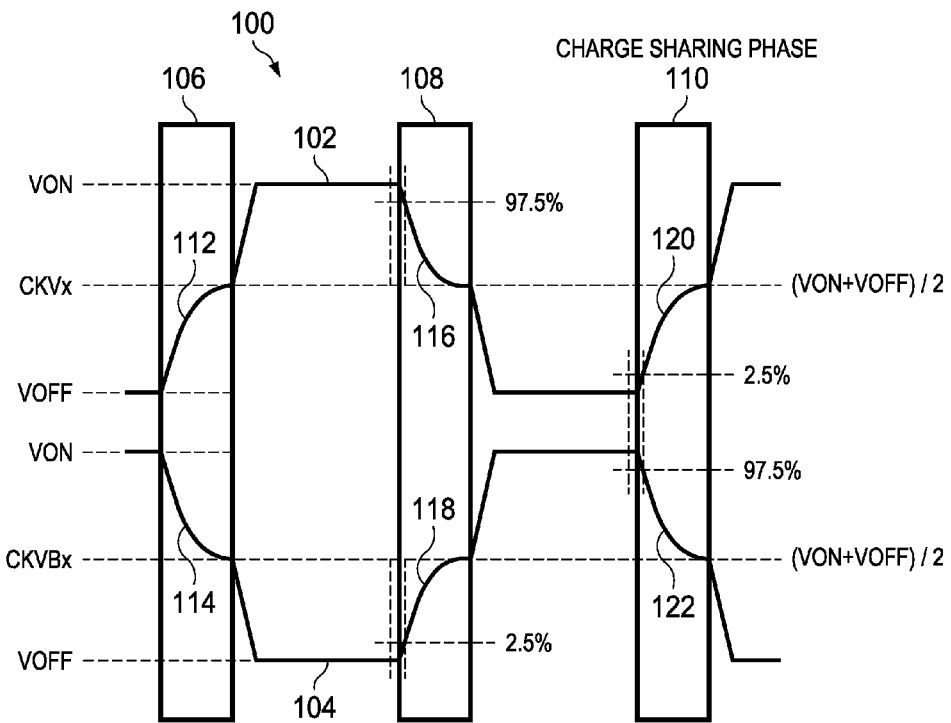
FIG. 1 is illustration of charge sharing between channels of an LCD.
Figure 3:
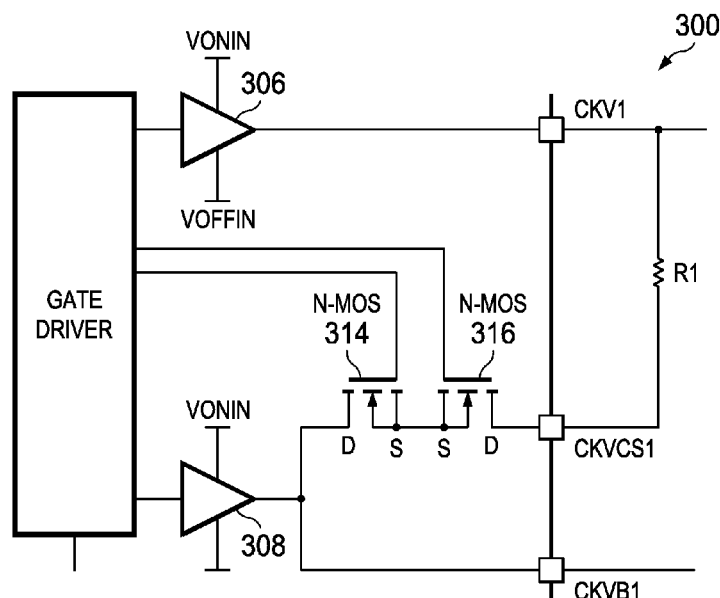
FIG. 3 is a schematic of a prior art circuit for charge sharing between channels using a shared resistor.
Figure 2:
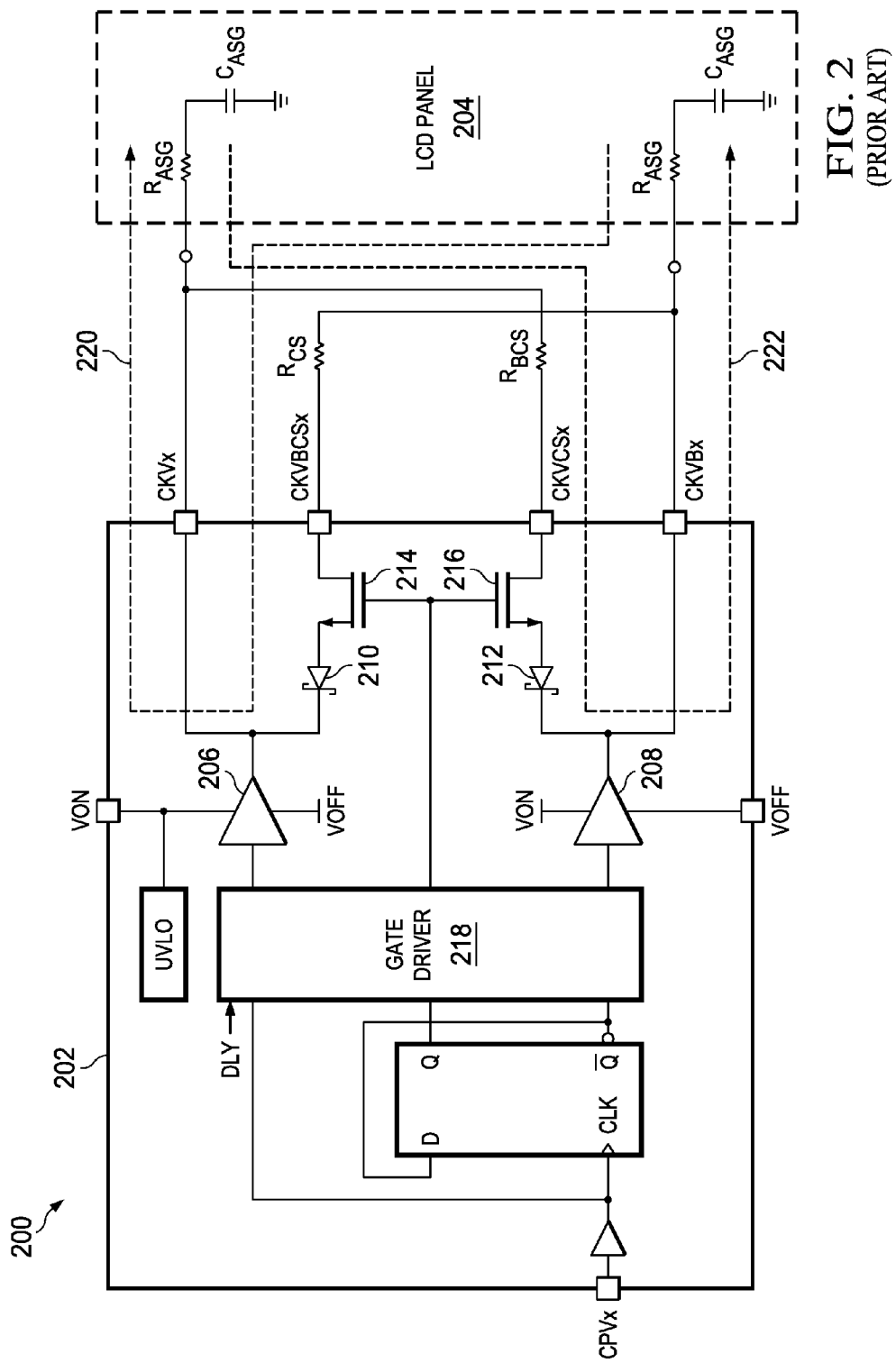
FIG. 2 is a schematic of a prior art circuit for performing charge sharing between channels.
Figure 4:
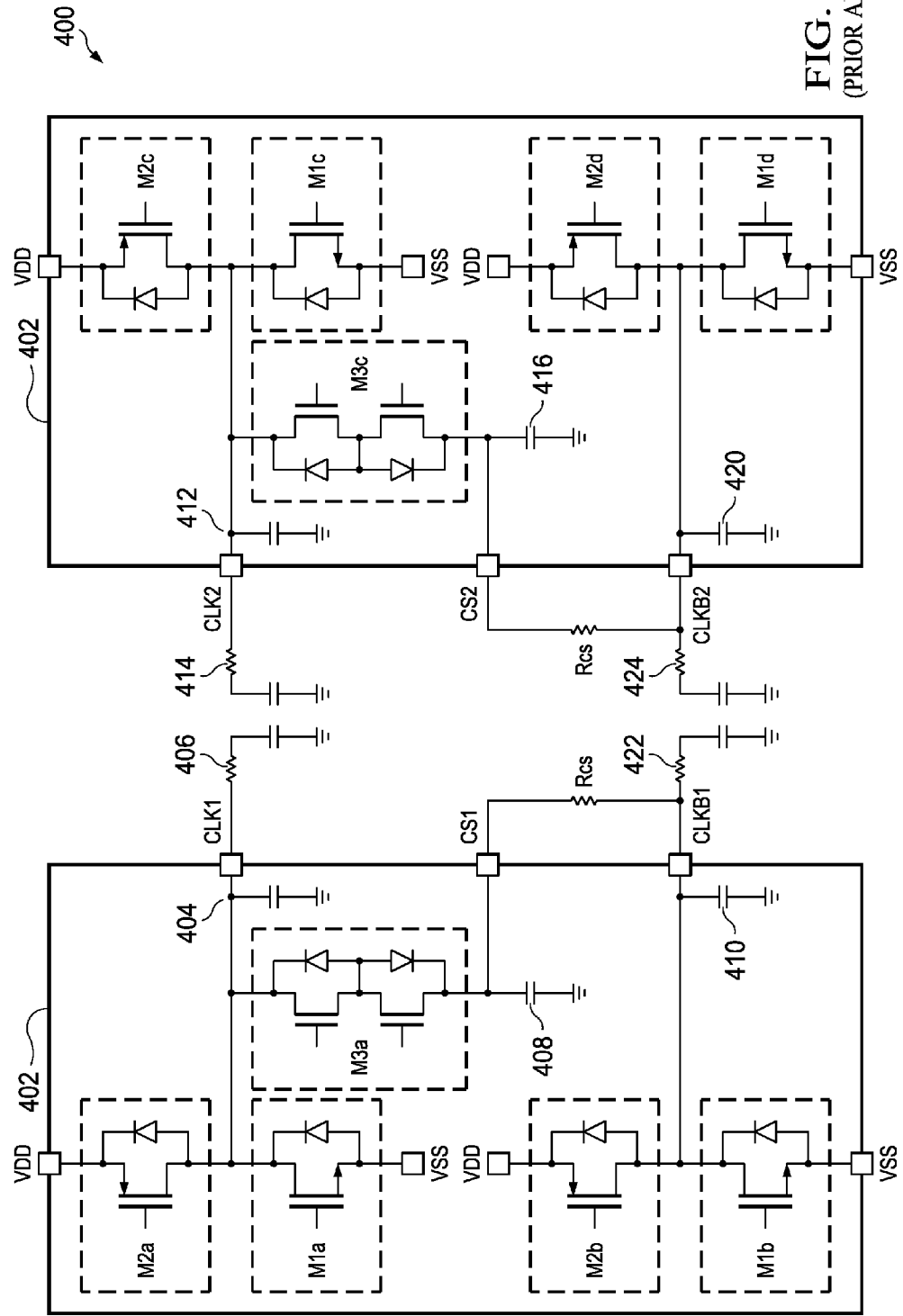
FIG. 4 is a schematic of a prior art circuit showing charge sharing between four channels utilizing two shared resistors.
Figure 5A:
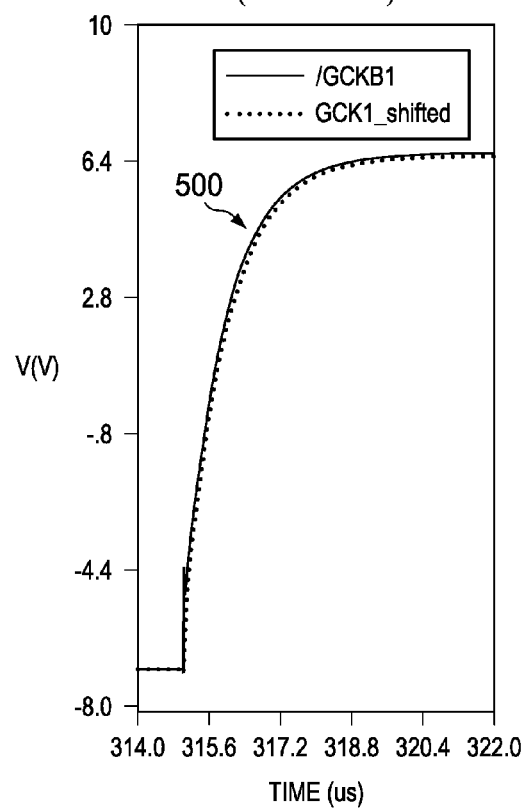
FIG. 5A is an illustration of a rising (charging) signal.
Figure 5B:
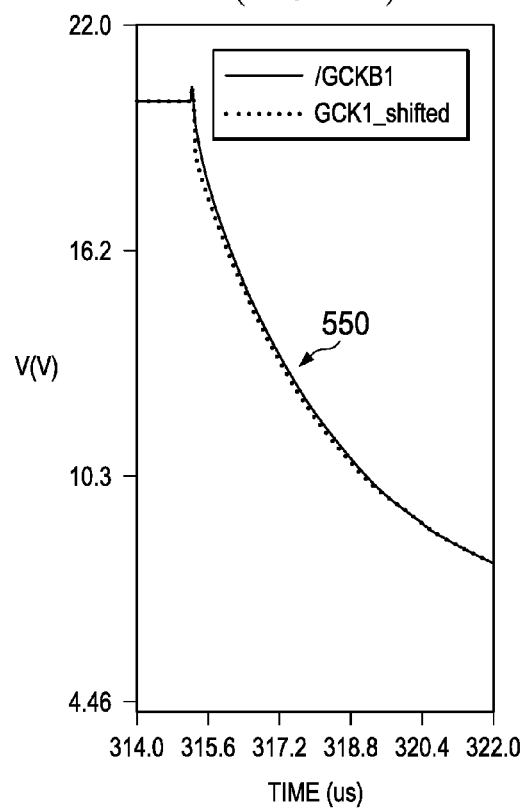
FIG. 5B is illustration of a falling (discharging) signal for charge sharing between channels.
Figure 6:
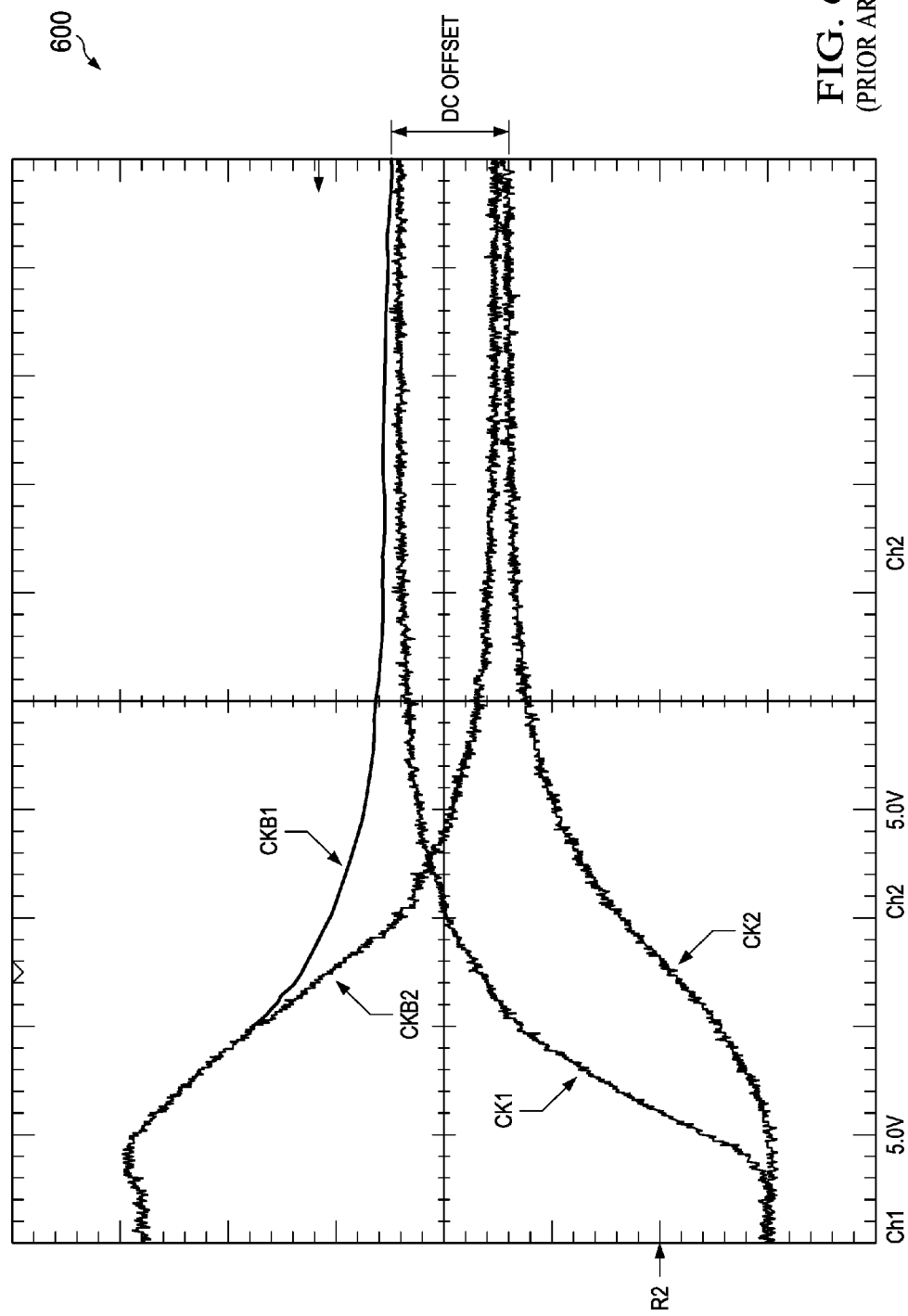
FIG. 6 shows a DC offset generated by the differences in slope between the signals of FIGS. 5A and 5B.

Row 706 is driven by a push-pull circuit comprising transistor M2$a$ in series with transistor M1$a$ and coupled between VDD and VSS. The output of the push-pull driver is taken between the two transistors and coupled to pin CLK1 which is coupled to the row 706. A parasitic capacitance 704 is present at pin CLK1. Also coupled to the pin CLK1 and the output of the push-pull driver circuit M1$a$ and M2$a$ are transistors M3$a$ which correspond to the same transistors illustrated in FIG. 4. The other terminal of the transistors M3$a$ is connected to pin CS1 as shown in FIG. 4. A parasitic capacitance 726 is present at pin CS1 similar to the parasitic capacitance 408 shown in FIG. 4.

A second row or channel CLKB 1 is driven by a push-pull driver circuit comprising transistor M2$b$ in series with transistor M1$b$ and coupled between VDD and VSS. The output of the push-pull driver is taken between the two transistors and coupled to pin CLKB1 which is coupled to the row 722. A parasitic capacitance 710 is present at pin CLKB1. Unlike the circuit shown in FIG. 4, the output of the push-pull driver M1$b$, M2$b$ and the pin CLKB1, is coupled via transistors M3$b$ to the pin CS2. The transistors M3$b$ are similar to the transistors M3$a$ discussed above. A parasitic capacitance 728 is present at pin CS2.

Similarly, to the drive for row 706, row 714 is driven by a push-pull circuit comprising transistor M2$c$ in series with transistor M1$c$ and coupled between VDD and VSS. The output of the push-pull driver is taken between the two transistors and coupled to pin CLK1 which is coupled to the row 706. A parasitic capacitance 712 is present at pin CLK2. Also coupled to the pin CLK2 and the output of the push-pull driver circuit M1$c$ and M2$c$ are transistors M3$c$ which correspond to the same transistors illustrated in FIG. 4. Unlike the circuit shown in FIG. 4, the other terminal of the transistors M3$c$ is connected to pin CS1. As discussed above, a parasitic capacitance 726 is present at pin CS1.

Similarly to the drive for row 722, a third row or channel CLKB2 is driven by a push-pull driver circuit comprising transistor M2$d$ in series with transistor M1$d$ and coupled between VDD and VSS. The output of the push-pull driver is taken between the two transistors and coupled to pin CLKB2 which is coupled to the row 724. A parasitic capacitance 720 is present at pin CLKB2. Unlike the circuit shown in FIG. 4, the output of the push-pull driver M1d, M2d and the pin CLKB2, are coupled via transistors M3d to the pin CS2. The transistors M3d are similar to the transistors M3a discussed above. As discussed above, a parasitic capacitance 728 is present at pin CS2.

A single resistor $R_{CS}$ is coupled between the pins CS1 and CS2 and serves as the resistance to control the slope of the charge and discharge of the capacitances for the row lines for all four rows or channels illustrated in FIG. 7. The resistor $R_{CS}$ may be the only component in the system illustrated in FIG. 7 to be external to the integrated circuit 702. Thus, criticality of this component has been removed.

In operation, each of the rows or channels is operated from a different phase of a clock signal, so that no two drivers are operating at the same time. During one phase, charge may be transferred from the capacitor in row 706 via pin CLK1, through transistors M3a, through pin CS1, resistor $R_{CS}$, pin CS2, through transistors M3b, through—pin CLKB1 into the capacitor for row 722, for example. In a second phase, charge flowing from the capacitor in row 722 would follow the opposite path for charging the capacitor in row 706. In a third phase, charge flowing from the capacitor in row 714 would flow through pin CLK2, through transistors M3c, pin CS1, resistor $R_{CS}$, pin CS2, through transistors M3d, pin CLKB2, into the capacitor for row 724, for example. In a fourth phase, charge flowing from the capacitor in row 724 would follow the opposite path for charging the capacitor in row 714. Other patterns of the charge/discharge cycle can be used as long as only one channel is active at a time.

Figure 8A:
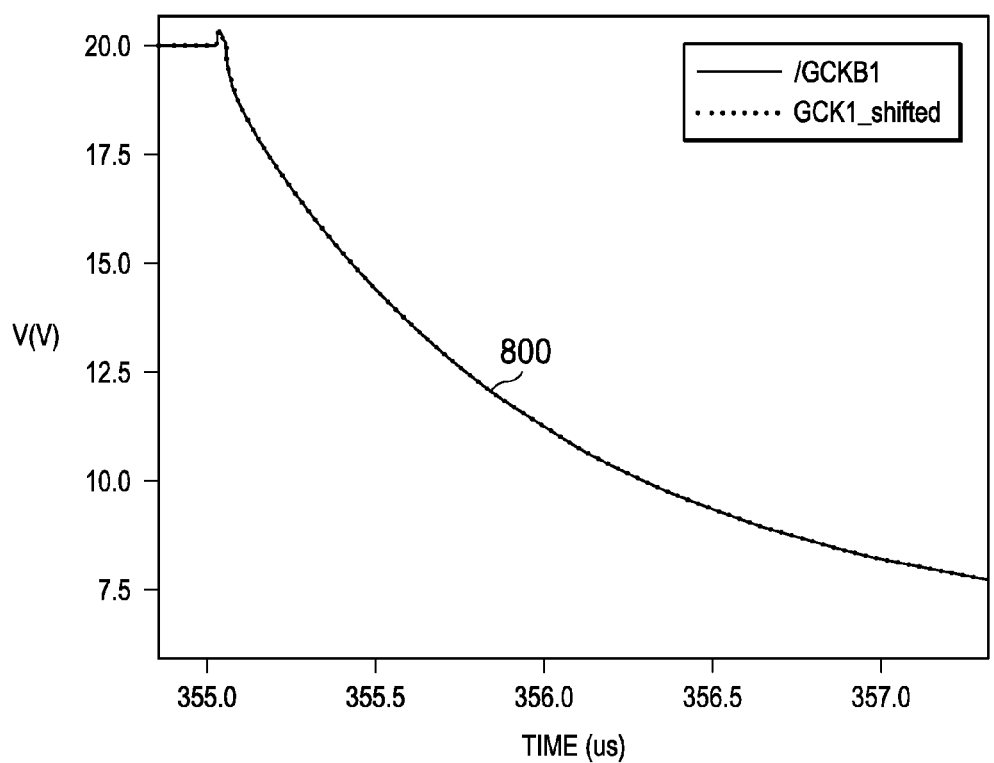
FIG. 8A shows the falling (discharging) signal of a pair of channels.
Figure 8B:
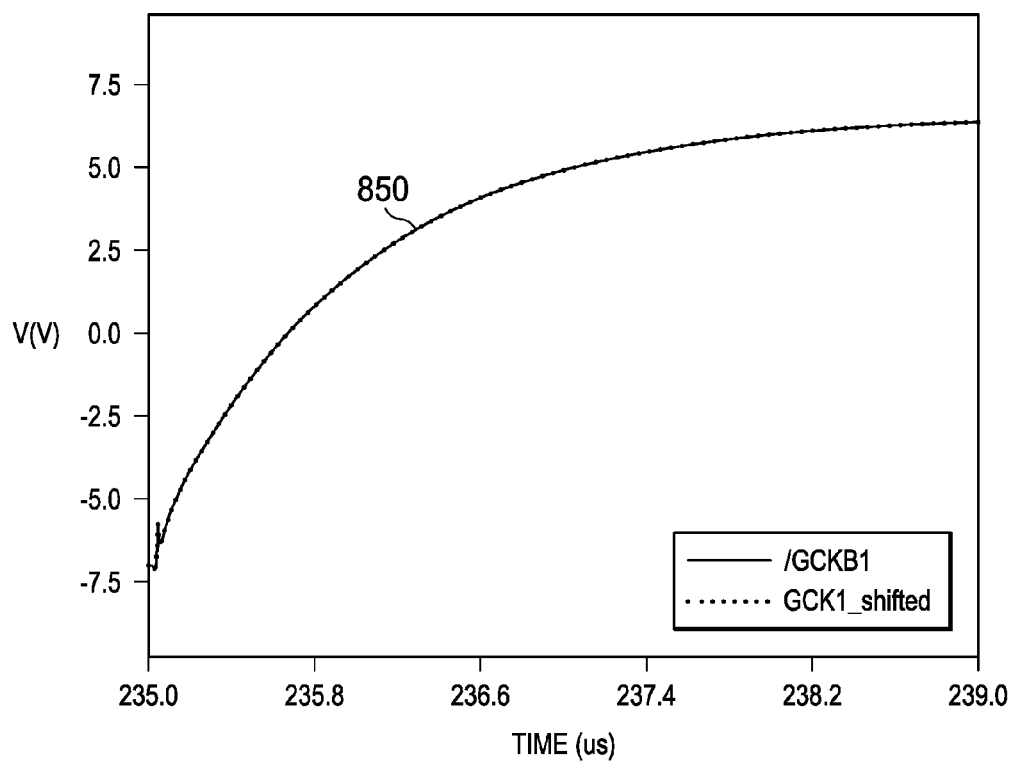
FIG. 8B shows a rising (charging) signal of a pair of channels for the circuit of FIG. 7.

It should be noted that the charge and discharge paths between the rows are identical for each pair of row drivers. It should further be noted that on an integrated circuit, the values of the parasitic capacitances at the various pins will be substantially the same, thus assuring that the charge and discharge paths between all of the rows is essentially the same. This is seen in FIG. 8A which shows the discharge waveform of two channels, phase shifted so that they are in time alignment. This waveform 800 appears to be a single waveform, whereas it is actually the waveform for two channels superimposed on each other. Thus a substantial identity of the two discharge cycles can be seen. Similarly, the waveform 850 in FIG. 8B shows the charging waveform of two channels with the waveforms time shifted so that they are superimposed upon each other.

Again, the waveform 850 appears to be a single waveform, whereas it is actually two identical waveforms superimposed upon each other. Thus, identity of the charge and discharge waveform can be seen, and, the visual effects produced by the circuit shown in FIG. 4 have been eliminated or very substantially reduced.

Furthermore, all of the charge/discharge paths utilize the same resistor $R_{CS}$. Thus, the time constant for all the channels will be substantially identical. Therefore, the criticality of this component selection has been removed. Furthermore, the same resistor can be utilized for additional pairs of channels saving pins or solder bumps on the integrated circuit, which will reduce the cost of the integrated circuit. Although a circuit utilizing four channels is shown in FIG. 7, the circuit can be expanded to other configurations by adding pairs of channels, but only a single resistor is needed. Thus, the circuit can comprise 6, 8, 10, etc. channels utilizing a single resistor $R_{CS}$.

Figure 9:
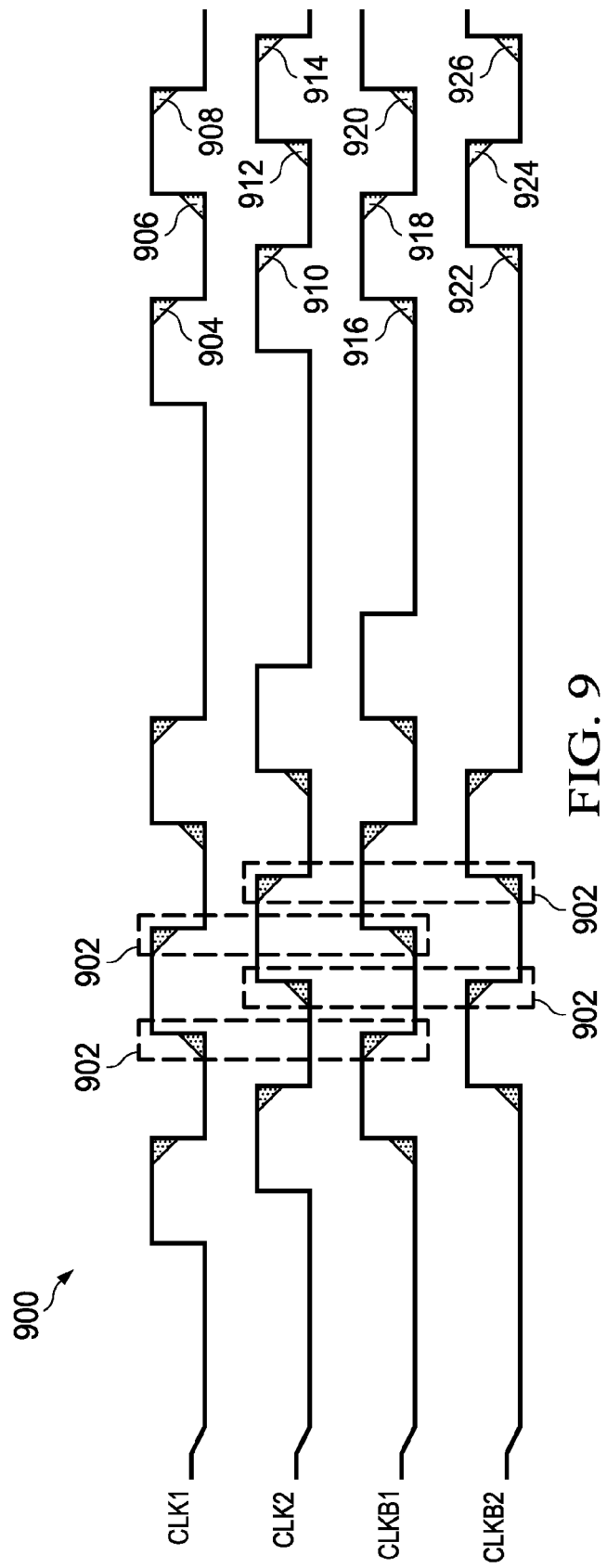
FIG. 9 shows the drive signals for four channels of an LCD having the charge sharing characteristics of the circuit shown in FIG. 7.

FIG. 9 shows the operation of the driver for the LCD. The signals CLK, CLK2, CLKB1 and CLKB2 correspond to the signals at the pins having the same label and FIG. 7. As can be seen, each of the signals are 90° out of phase with the preceding signal. Thus, the signal CLK2 lags the signal CLK1 by 90°. The signal CLKB1 lags the signal CLK2 by 90° and the signal CLKB2 lags the signal CLKB1 by 90°. Charge sharing is shown in the rectangles 902. The shaded areas represent the portions of the signal where charge sharing takes place. In the signals on the right side of the figure, charge sharing can be seen at 904, 906, 908, 910, 912, 914, 916, 918, 920, 922, 924 and 926.

Although the invention has been described in detail, it should be understood that various changes, substitutions and alterations can be made thereto without departing from the spirit and scope of the invention as defined by the appended claims.

The invention claimed is:

1. A level shifter for a display comprising:
   a first row line control circuit to control a first row line of the display;
   a second row line control circuit to control a second row line of the display;
   a third row line control circuit to control a third row line of the display;
   a fourth row line control circuit to control a fourth row line of the display;
   a first switch coupled to the first and the second row line control circuits for sharing charge stored on the first row line with the second row line;
   a second switch coupled to the third row line control circuit and the fourth row line control circuit for sharing charge stored on the third row line with the fourth row line; and
   a single resistor coupled between the first switch and the second row line control circuit and the single resistor coupled between the second switch and the fourth row line control circuit, wherein a slope of charge and discharge voltages on the row lines are substantially identical.

2. The level shifter of claim 1 wherein the four row line control circuits controlling the four row lines of the display are substantially identical.

3. The level shifter of claim 2 wherein all of the row line control circuits and a switch for each pair of row lines are on an integrated circuit and wherein the only component not integrated is the single resistor.

4. The level shifter of claim 1 wherein the row lines of the display are arranged in pairs to share charge stored on the row lines of the display and with all the row lines share charge utilizing the single resistor.

5. The level shifter of claim 4 wherein a number of row lines is expanded to 6, 8, or 10.

6. The level shifter of claim 5 wherein all of the row line control circuits and a switch for each pair of row lines are on an integrated circuit and wherein the only component not integrated is the single resistor.

7. The level shifter of claim 4 wherein all of the row line control circuits and a switch for each pair of row lines are on an integrated circuit and wherein the only component not integrated is the single resistor.

8. A display comprising:
   a display panel having pixels arranged in rows and columns;
   a level shifter circuit coupled to at least four row lines of the display panel, the level shifter shifting a voltage level of signals generated by a display pattern generator circuit to control the row lines of the display panel;
   a first pair of switches coupled between a first pair of row lines for sharing charge stored on a first row line with a second row line and a second pair of switches coupled between a second pair of row lines for sharing charge stored on a third row line with a fourth row line, each charge sharing being through a same resistor.

9. The display panel of claim 8 wherein the level shifter circuit comprises four substantially identical row line clock generator circuits.

10. The display panel of claim 9 wherein the level shifter circuit is an integrated circuit and wherein the only component not integrated is the same resistor.

11. The display panel of claim 8 wherein a number of row lines is expanded to 6, 8 or 10.

12. The display panel of claim 11 wherein the level shifter circuit is an integrated circuit and wherein the only component not integrated is the same resistor.

13. The display panel of claim 8 wherein the level shifter circuit is an integrated circuit and wherein the only component not integrated is the same resistor.

* * * * *